(12) United States Patent
Shi et al.

(10) Patent No.: US 10,571,499 B2
(45) Date of Patent: Feb. 25, 2020

(54) USB DATA PIN IMPEDANCE DETECTION

(71) Applicants: DIALOG SEMICONDUCTOR INC., Campbell, CA (US); DIALOG INTEGRATED CIRCUITS (TIANJIN) LIMITED, Tianjin (CN)

(72) Inventors: Fuqiang Shi, Los Gatos, CA (US); Jianming Yao, Cupertino, CA (US); Weihai Huang, Tianjin (CN); Yong Li, San Jose, CA (US); John William Kesterson, Seaside, CA (US)

(73) Assignees: DIALOG SEMICONDUCTOR INC., Campbell, CA (US); DIALOG INTEGRATED CIRCUITS (TIANJIN) LIMITED, Tianjin (CN)

( * ) Notice: Subject to any disclaimer, the term of this patent is extended or adjusted under 35 U.S.C. 154(b) by 20 days.

(21) Appl. No.: 15/508,477

(22) PCT Filed: Sep. 23, 2014

(86) PCT No.: PCT/CN2014/087237
§ 371 (c)(1),
(2) Date: Mar. 2, 2017

(87) PCT Pub. No.: WO2016/045001
PCT Pub. Date: Mar. 31, 2016

(65) Prior Publication Data
US 2017/0248641 A1    Aug. 31, 2017

(51) Int. Cl.
*G01R 27/14* (2006.01)
*G01R 31/02* (2006.01)
*G01R 31/04* (2006.01)

(52) U.S. Cl.
CPC ......... *G01R 27/14* (2013.01); *G01R 31/025* (2013.01); *G01R 31/043* (2013.01); *G01R 31/04* (2013.01)

(58) Field of Classification Search
CPC ..... G01R 27/14; G01R 31/025; G01R 31/043
See application file for complete search history.

(56) References Cited

U.S. PATENT DOCUMENTS 6,313,657 B1 * 11/2001 Hashimoto .......... G01R 31/319
                                                            324/762.02
6,975,103 B1 * 12/2005 Blom .................... G01R 15/125
                                                            324/523

(Continued)

FOREIGN PATENT DOCUMENTS

CN      1877347 A     12/2006
CN    101995912 A      3/2011

(Continued)

OTHER PUBLICATIONS

PCT International Search Report and Written Opinion, PCT/CN2014/087237, dated Jun. 19, 2015, 11 Pages.

(Continued)

*Primary Examiner* — Akm Zakaria
(74) *Attorney, Agent, or Firm* — Fenwick & West LLP

(57) ABSTRACT

A device for determining impedance at a data pin of a communication interface. In one embodiment, the device includes a current source configured to selectively inject a test current to the data pin. The device also includes a sensing circuit for sensing a first test voltage corresponding to a voltage at the data pin without the test current injected, and a second test voltage corresponding to another voltage at the data pin with the test current injected. The sensing circuit determines the impedance at the data pin based on the first test voltage and the second test voltage.

14 Claims, 5 Drawing Sheets

(56) References Cited

U.S. PATENT DOCUMENTS

| | | | |
|---|---|---|---|
| 7,508,228 B2* | 3/2009 | Walker | G01R 31/31924 324/750.3 |
| 2009/0058435 A1 | 3/2009 | Nakamura | |
| 2012/0126859 A1 | 5/2012 | Kawamoto et al. | |
| 2013/0271167 A1* | 10/2013 | Thiruvengadam | G01R 31/2607 324/750.02 |
| 2015/0268289 A1* | 9/2015 | Onodera | G01R 31/025 324/750.3 |
| 2015/0303724 A1* | 10/2015 | Lin | H02J 7/0052 320/162 |
| 2016/0261127 A1* | 9/2016 | Worry | G01R 31/3624 |
| 2017/0138998 A1* | 5/2017 | Lin | G01R 31/043 |

FOREIGN PATENT DOCUMENTS

| | | |
|---|---|---|
| CN | 102288831 A | 12/2011 |
| CN | 202854303 U | 4/2013 |

OTHER PUBLICATIONS

China National Intellectual Property Administration, Notification of the First Office Action, CN Patent Application No. 201480082118.1, dated Nov. 5, 2018, 16 pages.

* cited by examiner

USB DATA PIN IMPEDANCE DETECTION

BACKGROUND

1. Field of Art

The disclosure generally relates to a power supply, and more specifically detecting an improper loading condition of the power supply.

2. Description of the Related Art

With the proliferation of portable electronic devices (e.g., a smart phone, tablet computer, laptop, etc.), safe and efficient charging of batteries becomes important. In case of an improper condition in the connection between a charger and a loading device (e.g., a portable electronic device), for example due to shorted pins or partially shorted pins, supplying power to the loading device leads to unnecessary power consumption and may cause damages to the loading device and/or the charger. To avoid such damages, the loading device can notify the charger of an improper loading condition, and the charger may shutdown the power supply to stop supplying power to the loading device in response. For instance, for charging through a Universal Serial Bus (USB) interface, one common approach involves using the data signal pins (e.g. D+/D− pin) in USB connectors to indicate from the loading device whether any improper condition exists.

However, in case the data signal pins are damaged or shorted, the loading electronic device is unable to inform the charger of the improper condition. As a result, the charger continues to supply power to the portable electronic device, and may cause damages to the loading device and/or the charger.

SUMMARY

Embodiments relate to a device for determining a proper loading condition. The device determines impedance at a data pin of a communication interface for determining the loading condition of the pin.

In one embodiment, the device includes a current source configured to selectively inject a test current to the data pin. The device also includes a sensing circuit for sensing a first test voltage corresponding to a voltage at the data pin without the test current injected, and a second test voltage corresponding to another voltage at the data pin with the test current injected. The sensing circuit determines the impedance at the data pin based on the first test voltage and the second test voltage.

In one embodiment, the device determines that the data pin has a short condition responsive to the determined impedance being smaller than threshold impedance.

In one embodiment, the first test voltage is a scaled-down voltage of the voltage at the data pin without the test current injected and the second test voltage is a scaled-down voltage of said another voltage at the data pin with the test current injected.

In one embodiment, the device determines that the data pin has a short condition responsive to the second test voltage being smaller than the first test voltage added with a predetermined threshold voltage.

In one embodiment, the sensing circuit includes a first resistor coupled between the data pin and a node, and a second resistor coupled between the node and a second voltage. The first test voltage and the second test voltage may be sensed at the node. The sensing circuit may further include a first switch coupled in series with the second resistor between the node and the second voltage.

The sensing circuit may further include a sample and hold circuit coupled to the node to sense and hold the first test voltage. The sensing circuit may also include a comparator to compare the first test voltage and the second test voltage. The sensing circuit may determine the impedance at the data pin based on the comparison of the first test voltage and the second test voltage. The sample and hold circuit may include a capacitor and a second switch coupled between the node and the capacitor. The capacitor may store the first test voltage responsive to the second switch being turned on. A predetermined threshold voltage may be added to the first test voltage held by the sample and hold circuit, and the sensing circuit may determine that the data pin has a short condition based on the comparison of the second test voltage with the first test voltage to which the predetermined threshold voltage is added. The device may determine that the data pin has a short condition responsive to the second test voltage being smaller than the first test voltage with the predetermined threshold voltage added to the first test voltage.

In one embodiment, the communication interface is a Universal Serial Bus (USB) interface, and the data pin is one of D+ pin and D− pin of the USB interface.

Embodiments also relate to a method for determining impedance at a data pin of a communication interface. In one embodiment, the method includes sensing a first test voltage corresponding to a voltage at the data pin without a test current injected to the data pin. The method also includes injecting the test current to the data pin. The method includes sensing a second test voltage corresponding to another voltage at the data pin with the test current injected. Additionally, the method includes determining the impedance at the data pin based on a comparison of the first test voltage with the second test voltage.

In one embodiment, the method further includes determining that the data pin has a short condition responsive to the determined impedance being smaller than threshold impedance. The threshold impedance varies depending on the application, e.g. from 100Ω to 1000Ω or any other abnormally low value that impacts the correct communication between the devices.

In one embodiment, the method further includes determining that the data pin has a short condition responsive to the second test voltage being smaller than the first test voltage.

In one embodiment, the method further includes scaling-down the voltage at the data pin without the test current injected to the data pin to generate the first test voltage. The method also includes scaling-down said another voltage at the data pin with the test current injected to the data pin to generate the second test voltage.

In one embodiment, the method includes adding a predetermined threshold voltage to the first test voltage. Determining the impedance at the data pin may be performed with the first test voltage added with the predetermined threshold voltage. The method may also include determining that the data pin has a short condition responsive to the second test voltage being smaller than the first test voltage with the predetermined threshold voltage added to the first voltage.

In one embodiment, the method further includes sampling the first test voltage and holding the first test voltage. The second test voltage is sensed while the first test voltage is held, and determining the impedance at the data pin is performed with the first test voltage held.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
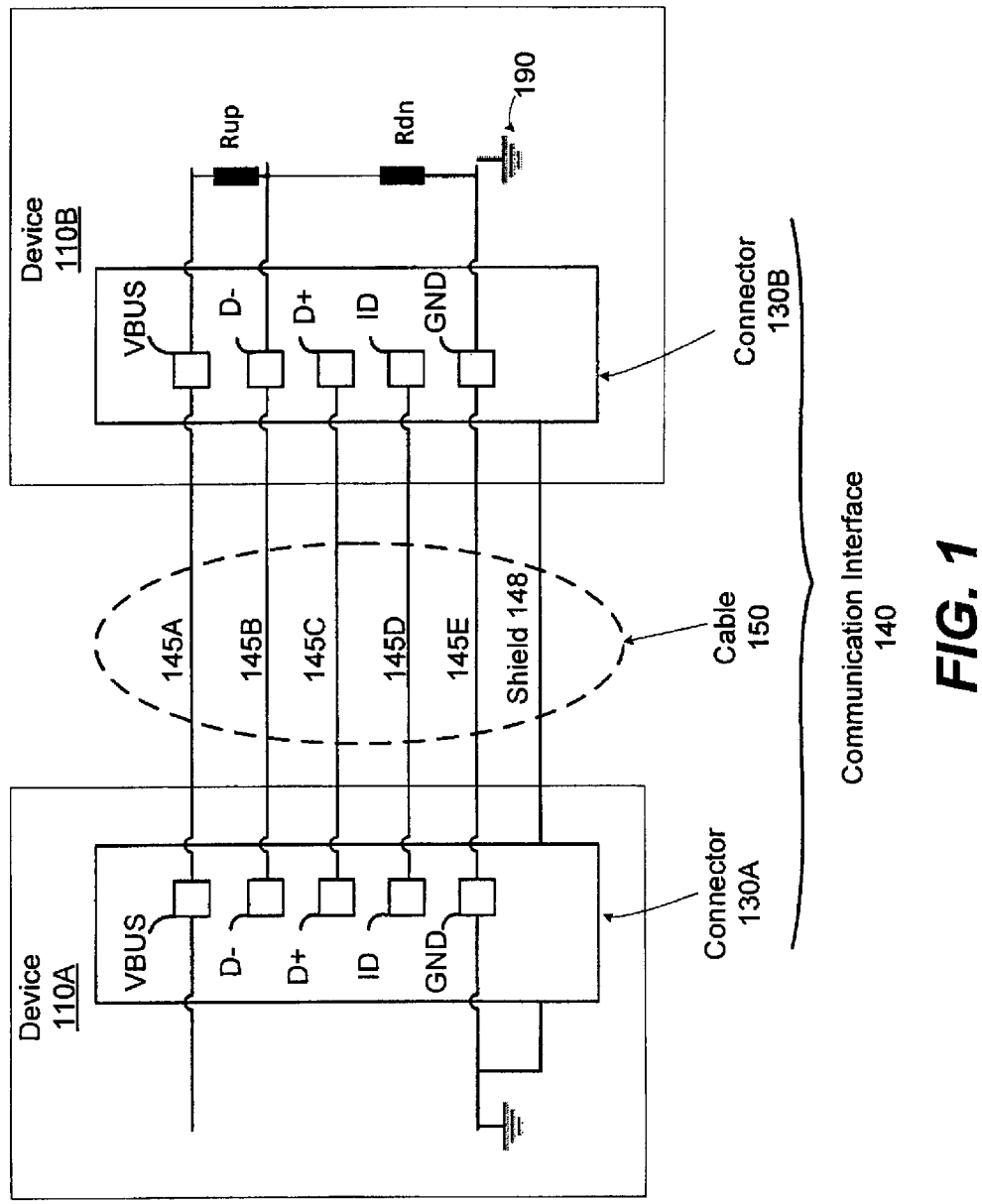
FIG. 1 is a block diagram of two devices communicating through a communication interface, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments herein relate to a device establishing a proper connection with another device through a communication interface. In one embodiment, the device determines a loading condition to establish a proper connection with another device. The device determines the loading condition by measuring impedance at a data pin of the communication interface. Responsive to determining a proper loading condition, the device establishes a connection with another device. In addition, responsive to determining an improper loading condition, the device terminates a connection with another device or discontinues supplying power to another device.

Improper loading condition herein refers to a loading condition of a device's data pin with low impedance due to a shorted or partially shorted connection. For example, a device's data pin has an improper loading condition with an impedance value of less than 100Ω or other abnormally low values that can impede proper communication.

Example Communication Device

FIG. 1 illustrates two electronic devices 110A and 110B. The device 110A communicates with the device 110B through communication interface 140. The devices 110A and 110B may exchange data streams, a control signal or a status notification through the communication interface 140. Additionally, the device 110A may supply power to the device 110B through the communication interface 140.

In one embodiment, the device 110A is a charger supplying power to the device 110B through communication interface 140. The device 110A may be any electronic device capable of providing power to the device 110B. For example, the device 110A is a charger, computer, or a mobile handheld device. The device 110B is a loading device, which can be any electronic device receiving power from the device 110A through the communication interface 140. For example, the device 110B is a computer, or a mobile handheld device. The device 110B may include a battery to store the supplied power from the device 110A. In one embodiment, the device 110A is a power charger unit, the device 110B is a portable electronic device (e.g., a mobile handheld device), and communication interface 140 is a Universal Serial Bus (USB) interface.

The devices 110A and 110B are communicatively coupled to each other through the communication interface 140. The communication interface 140 includes a connector 130A on the device 110A, another connector 130B on the device 110B, and a cable 150 coupled between the connectors 130. Each connector 130 includes multiple physical pins, and the cable 150 includes multiple connection lines 145 (e.g., 145A, 145B, 145C, 145D, 145E, etc.). In one implementation, each pin of the connector 130A is coupled to its corresponding pin of the connector 130B through a respective connection line 145. For example, a data pin of the connector 130A is coupled to a corresponding data pin of the connector 130B through a connection line 145. In other implementations, some pins may not be connected, or a single pin in one device is connected to multiple pins in another device.

In one embodiment, the communication interface 140 is a Universal Serial Bus (USB) interface including USB connectors 130A, 130B, and a USB cable 150. Each of the USB connectors 130A and 130B includes VBUS, D+, D−, identification (ID), and ground (GND) pins. VBUS pin is used to provide a high supply voltage. D+ and D− pins are data pins used to transfer data. ID pin is used for identifying which device is connected to the USB cable. GND pin is used to supply a low supply voltage (e.g., a ground voltage). VBUS, D+, D−, ID, and GND pins in the connectors 130A and 130B are coupled to each other through connection lines 145A through 145E respectively. The cable 150 may also include a shield 148 to reduce electrical noise from affecting the signals and to reduce electromagnetic radiation that may interfere with other devices. Preferably, the shield 148 is coupled to the low supply voltage 190.

Often, the cable 150 or one of the connectors 130 becomes damaged, thereby impeding proper communication between two devices 110. The cable 150 or a connector 130 may be damaged due to dust or a poor connection. For example, a data pin (e.g., D−) in the device 110B becomes shorted with relatively low parasitic (i.e., undesired) impedance and reduces signal amplitude. The reduced signal amplitude obstructs communication between two devices 110. In case the data pin is shorted to a pin (e.g., VBUS) for providing a high supply voltage, parasitic impedance between two shorted pins can be represented as a resistor Rup. Similarly, in case the data pin is shorted to a pin (e.g., GND) for providing a low supply voltage 190, parasitic impedance between two shorted pins can be represented as a resistor Rdn. Hence, parasitic impedance at the data pin can be represented as a parallel combination of resistors Rup and Rdn (i.e., Rup||Rdn). When the parasitic impedance is substantially low (e.g., <100Ω), total impedance at the data pin including the load impedance and the parasitic impedance becomes close to the parasitic impedance.

Measuring the impedance at the data pin in the device 110A allows the device 110A to determine an improper loading condition without receiving a notification or indication from the device 110B. The device 110A determines an improper loading condition when the total impedance measured is less than a certain threshold (e.g., 100Ω). Hence, the device 110A may become aware of the improper loading condition and respond accordingly. For example, the device 110A may terminate the connection or stop supplying power to the device 110B responsive to determining the improper loading condition.

Figure 2:
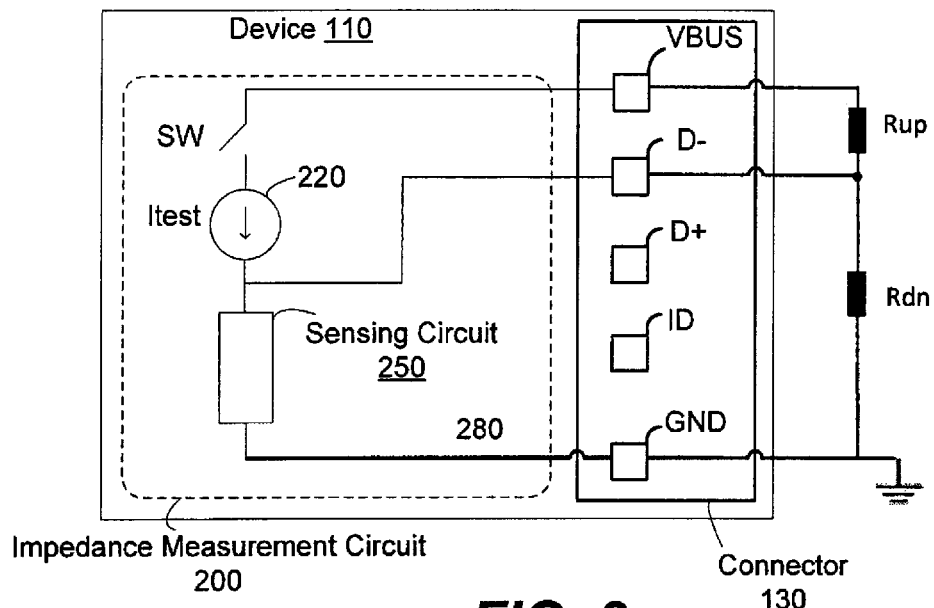
FIG. 2 is a block diagram illustrating a device with an example impedance measurement circuit for identifying an improper loading condition, according to one embodiment.

FIG. 2 illustrates a device 110 with an example impedance measurement circuit 200 for identifying improper loading condition, according to one embodiment. The impedance measurement circuit 200 includes a current source 220, the sensing circuit 250, and a switch SW. Together, these components are used to determine impedance, including parasitic impedance of Rup and Rdn at the data pins (e.g., D+ or D-). The example shown in FIG. 2 illustrates the case where the sensing circuit 250 is used to determine the impendence of one of the data pins D-.

In one aspect, the impedance measurement circuit 200 determines impedance at one of the data pins of the connector 130 by injecting test current Itest to the data pin using the current source 220. In one implementation, the current source 220 is coupled between a pin (e.g., VBUS) for providing a high supply voltage and the data pin (e.g., D-). The switch SW may be coupled in series with the current source 220 between the pin (e.g., VBUS) and the data pin for selectively injecting test current Itest to the data pin. As will be explained in more detail below, the sensing circuit 250 uses a voltage at the data pin without the test current Itest injected and another voltage at the data pin with the test current Itest injected to determine impedance at the data pin.

In one implementation, the impedance measurement circuit 200 determines impedance at multiple data pins, for example, by multiplexing. In another implementation, the device 110 includes a plurality of impedance measurement circuits 200, where each one of the plurality of impedance measurement circuits 200 determines impedance at its corresponding pin. Based on the determined impedance, the device 110 identifies improper loading condition at the data pin.

Figure 3:
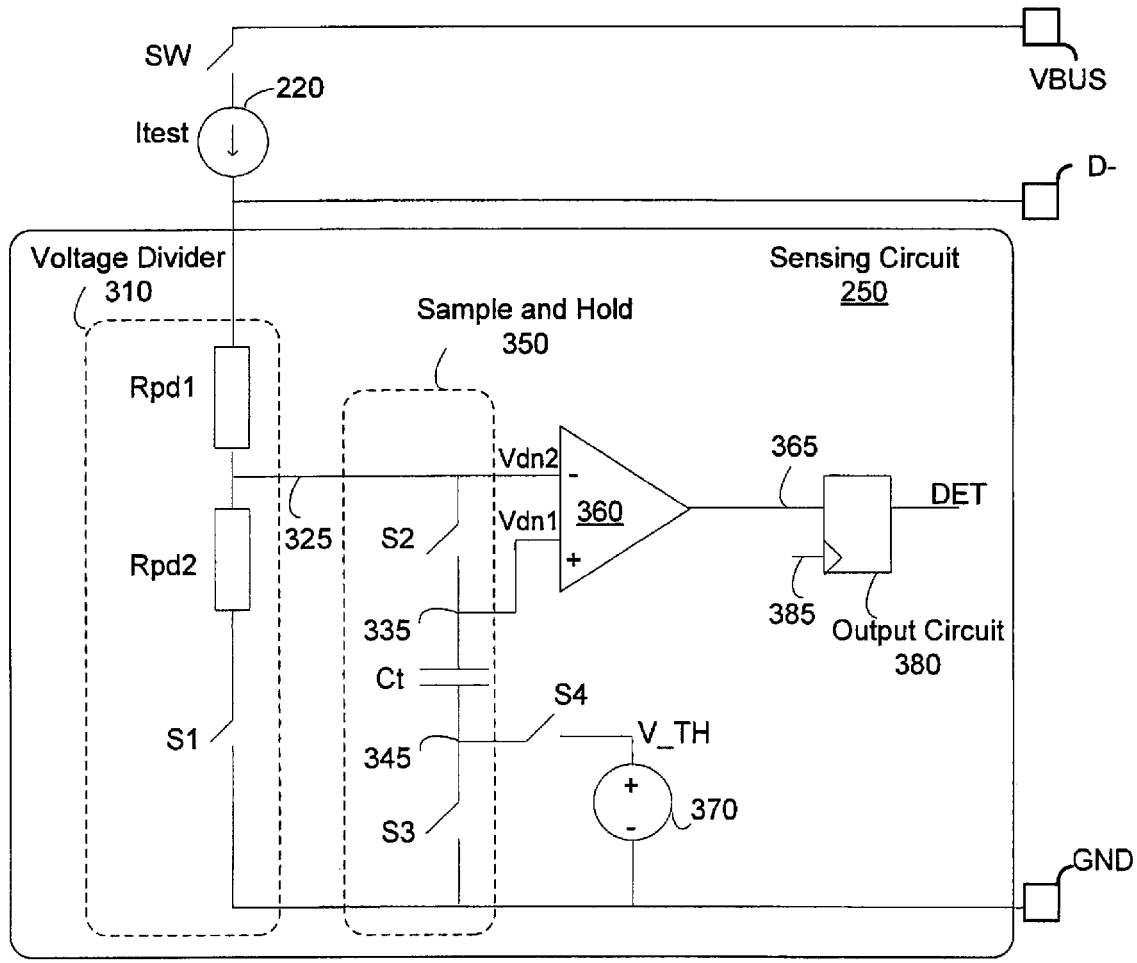
FIG. 3 is a detailed block diagram of a sensing circuit in the impedance measurement circuit of FIG. 2, according to one embodiment.

FIG. 3 is a detailed block diagram of the sensing circuit 250 in the impedance measurement circuit 200 of FIG. 2, according to one embodiment. In one implementation, the sensing circuit 250 includes a voltage divider circuit 310, a sample and hold circuit 350, a comparator 360, a threshold voltage supply 370, and an output circuit 380. The voltage divider circuit 310 includes resistors Rpd1, Rpd2 and divides (i.e., scales-down) a voltage at the data pin (e.g., D-) to generate a scaled-down voltage at a node 325. The voltage divider circuit 310 may also include a switch S1 for enabling and disabling the voltage division. In one implementation, the resistor Rpd1 is coupled between a pin of which the impedance is to be measured (the data pin (e.g., D-) in this example) and the node 325. Preferably, the second resistor Rpd2 and the switch S1 are coupled in series between the node 325 and the low supply voltage (GND).

The voltage divider circuit 310 performs voltage division of a voltage at the data pin based on operation of the switch S1. When the switch S1 is off, a voltage at the node 325 is substantially equal to a voltage of the data pin because no current flow through the resistors Rpd1, Rpd2. When the switch S1 is on, a voltage at the node 325 is a scaled-down voltage of a voltage at the data pin D-. By dividing the voltage at the data pin, the voltage divider circuit 310 enables the sample and hold circuit 350 to properly operate even when the voltage at the data pin is very large, for example, close to a voltage level of the high voltage supply.

In one implementation, the sample and hold circuit 350 includes a capacitor Ct and switches S2, S3. In one implementation, a first input (e.g., a negative input) of the comparator 360 is coupled to the node 325, and a second input (e.g., a positive input) of the comparator 360 is coupled to a node 335, where a switch S2 is coupled between the node 325 and the node 335. The capacitor Ct is coupled between the node 335 and a node 345.

The switches S3, S4 and the threshold voltage supply 370 perform addition of a predetermined threshold voltage V_TH to a voltage held by the sample and hold circuit 350. In one implementation, the switch S3 is coupled between the node 345 and a low supply voltage (e.g., GND). The switch S4 is coupled between the node 345 and the threshold voltage supply 370 having a predetermined threshold voltage V_TH. Preferably, the switches S3 operates in a same state of the S2, and the switch S4 operates in an opposite state of the states of the switches S2 and S3.

For obtaining a voltage at the node 325 without the test current Itest injected, the switch SW is disabled and the voltage divider circuit 310 is enabled (i.e., the switch SW is turned off and the switch S1 is turned on). The switch S2 is turned on to couple the node 325 and the node 335, the switch S3 is turned on to couple the node 345 to the low supply voltage, and the switch S4 is turned off to decouple the node 345 from the threshold voltage supply 370. Hence, the capacitor Ct is charged for sampling the voltage at the node 335, which is a scaled-down voltage of a voltage at the data pin D- without the test current Itest injected. This voltage is stored in the capacitor Ct as voltage Vdn1, which is the positive input of comparator 360. After sampling of Vdn1, the switches S2 and S3 are turned off to hold the voltage Vdn1 at the node 335 with the charges stored on the capacitor Ct. For the sensing circuit in FIG. 3, the voltage Vdn1 at the node 335 can be calculated as the following equation:

$$Vdn1 = Vbus * \frac{R_{dn}||(R_{pd1} + R_{pd2})}{R_{up} + R_{dn}||(R_{pd1} + R_{pd2})} * \frac{R_{pd2}}{R_{pd1} + R_{pd2}} \qquad \text{Eq. 1)}$$

When the voltage Vdn1 at the node 335 is held, the switch S4 is turned on to add the predetermined threshold voltage V_TH to the voltage Vdn1 at the node 335. In one approach, the predetermined threshold voltage V_TH may be calculated as the following equation:

$$V_{TH} = I_{test} * R_{up}||R_{dn}||(R_{pd1} + R_{pd2}) * \left(\frac{R_{pd2}}{R_{pd1} + R_{pd2}}\right) \qquad \text{Eq. 2)}$$

In one aspect, parasitic impedance Rup||Rdn is determined as target impedance (e.g., 100Ω). For sensing a voltage at the node 325 with the test current Itest injected, the switch SW and the voltage divider circuit 310 is enabled (i.e., the switch SW is turned on and the switch S1 is turned on.) The switch S2 is turned off to decouple the node 325 and the node 335. The voltage Vdn2 at the node 325 increases according to the test current Itest injected to the data pin D- and the impedance at the data pin D-. Thus, the voltage Vdn2 at node 325 reflects the scaled down voltage of a voltage at the data pin D- with the test current Itest injected to the data pin D-, which appears as voltage Vdn2 at node 325 and the negative input of comparator 360. For the sensing circuit in FIG. 3, the voltage Vdn2 at the node 325 can be calculated as the following equation:

$$Vdn2 = Vbus * \frac{R_{dn}||(R_{pd1} + R_{pd2})}{R_{up} + R_{dn}||(R_{pd1} + R_{pd2})} * \frac{R_{pd2}}{R_{pd1} + R_{pd2}} + \\ I_t * R_{up}||R_{dn}||(R_{pd1} + R_{pd2}) * \frac{R_{pd2}}{R_{pd1} + R_{pd2}} \qquad \text{Eq. 3}$$

After sensing the voltage Vdn2 at the node 325 with the test current Itest injected and the voltage Vdn1 at the node 335 without the test current Itest injected, the comparator 360 compares the voltages Vdn1 and Vdn2 to generate the comparison signal 365. In one approach, if the voltage Vdn2 is lower than the voltage Vdn1 with the predetermined threshold voltage V_TH added to Vdn1, the comparator 360 generates a comparison signal 365 with a high state. If the voltage Vdn2 is not lower than the voltage Vdn1 with the predetermined threshold voltage V_TH added to Vdn1, the comparator 360 generates a comparison signal 365 with a low state.

The output circuit 380 receives the comparison signal 365 from the comparator 360 and generates an impedance detection signal DET according to an enable signal 385. The output circuit 380 stores the comparison signal 365 state (high or low) and generates an impedance detection signal DET as its output. In one aspect, the impedance detection signal DET in a high state indicates the impedance at the data pin D− is low, because Vdn2 with the test current Itest injected is lower than Vdn1 without the test current Itest injected due to an improperly low impedance condition at the data pin D−, thus indicating that the data pin D− has an improper loading condition such as short or partial short condition. Similarly, the impedance detection signal DET in a low state indicates the impedance at the data pin D− is normally high, because Vdn2 with the test current Itest injected is higher than Vdn1 without the test current Itest injected due to a normal impedance condition at the data pin D−, thus indicating that the data pin D− has a proper loading condition. In one implementation, the output circuit 380 is a latch, and the impedance detection signal DET is generated based on the comparison signal 365, when the enable signal 385 is in an enable state (e.g., a high state). In another implementation, the output circuit 380 is a flip flop, and the impedance detection signal DET is generated based on the comparison signal 365, when the enable signal 385 transitions from one state (e.g., low state) to another state (e.g., high state).

Figure 4:
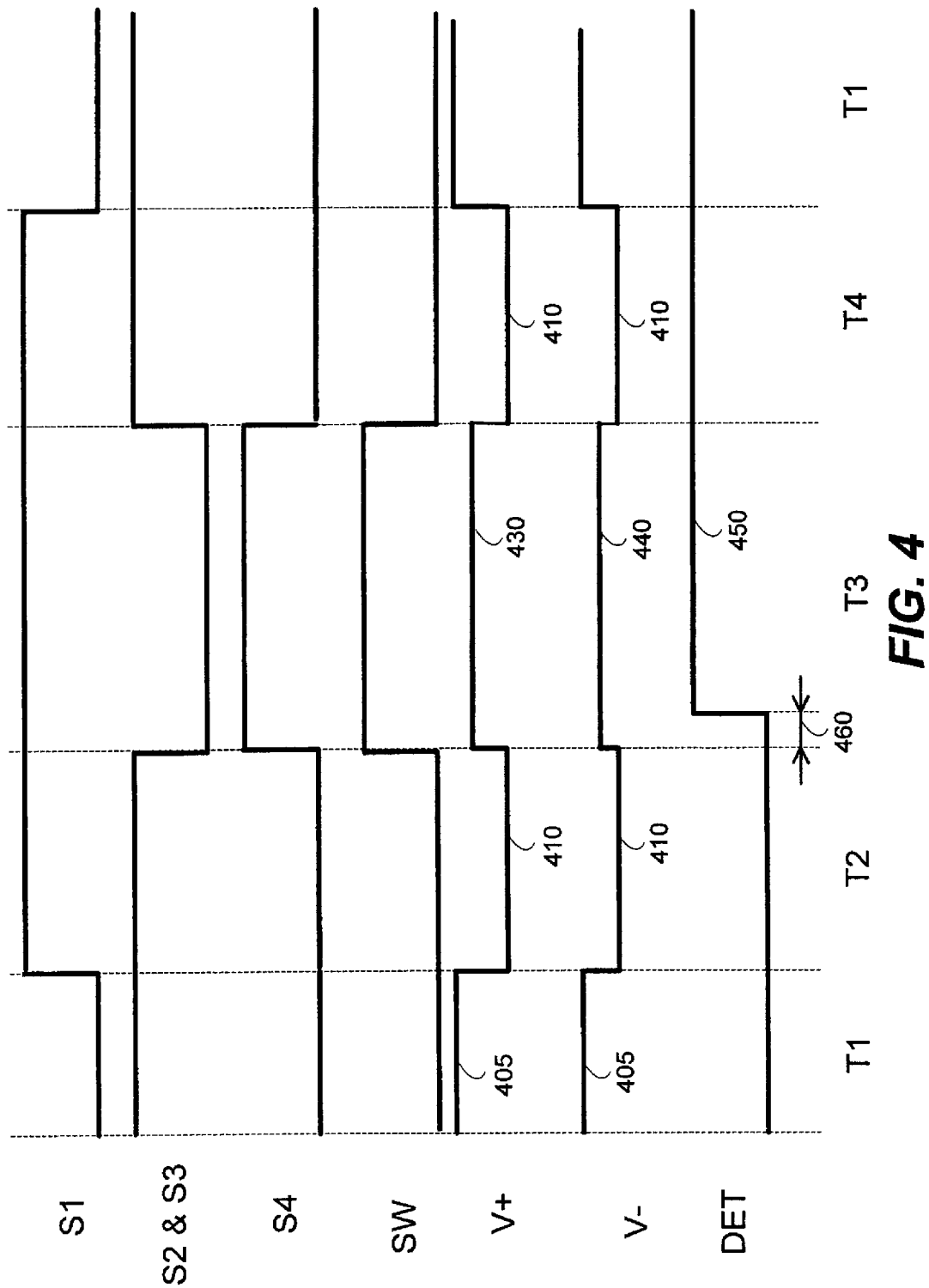
FIG. 4 illustrates a timing diagram illustrating the operation of the impedance measurement circuit of FIG. 3, according to one embodiment.

Referring to FIG. 4, illustrated is a timing diagram of the operation of the impedance measurement circuit 200 of FIG. 3, according to an embodiment. The timing diagram includes waveforms for the switches S1, S2, S3, S4, SW, a positive input voltage V+ of the comparator 360 at the node 335, a negative input voltage V− of the comparator 360 at the node 325, and the impedance detection signal DET. In one approach, the impedance measurement circuit 200 operates in four phases T1, T2, T3, and T4, as illustrated in FIG. 4. In other embodiments, the impedance measurement circuit 200 may operate in different and/or additional phases.

In the first phase T1, the impedance measurement circuit 200 is disabled. The switches SW and S1 are turned off to disable test current Itest from flowing through the data pin. The switches S2 and S3 are turned on, and the switch S4 is turned off. Thus, the positive input voltage V+ and the negative input voltage V− are substantially equal to each other at a voltage level 405 at the data pin. Furthermore, the impedance detection signal DET, for example, in a low state indicates no improper impedance is detected.

In the second phase T2, the impedance measurement circuit 200 senses (or samples) a voltage at the node 325 corresponding to a voltage at the data pin. The first switch S1 is turned on and the voltage divider circuit 310 of the impedance measurement circuit 200 is enabled. In addition, the switches S2 and S3 remain turned on, and the switch S4 remains turned off. The resisters Rpd1 and Rpd2 pull down the voltage at the node 325. Accordingly, the positive input voltage V+ of the comparator 360 at the node 335 and the negative input voltage V− of the comparator 360 at the node 325 reach a voltage level 410. The sample and hold circuit 350 samples the voltage level 410 at the nodes 325, 335 without the test current Itest injected as voltage Vdn1.

In the third phase T3, the impedance measurement circuit 200 holds the sampled voltage and determines impedance at the data pin. The switches S2 and S3 are turned off, and the switch S4 is turned on. Hence, the predetermined threshold voltage V_TH is added to the voltage Vdn1 at the node 335, and the positive input voltage V+ of the comparator 360 at the node 335 reaches the voltage level 430. In addition, the switch SW is turned on to enable the current source 220 and to inject the test current Itest to the data pin. With the test current Itest injected, the negative input voltage V− of the comparator 360 at the node 325 reaches the voltage level 440. The comparator 360 senses the voltage Vdn2 at the node 325 in level 440, and compares the voltage Vdn1 at the node 335 in level 430 and the voltage Vdn2 at the node 325 in level 440. In one example, if the voltage Vdn2 at the node 325 in level 440 is less than the voltage Vdn1 at the node 335 in level 430, indicating an improper load condition at data pin D−, the impedance measurement circuit 200 generates the detection signal DET in a high state 450. The detection signal DET may be generated with a certain delay 460 according to the enable signal 385 which latches the comparison signal 365.

In the fourth phase T4, the impedance measurement circuit 200 is reset. The first switch S1 remains turned on to enable the voltage divider circuit 310 of the impedance measurement circuit 200. In addition, the switches S2 and S3 are turned on, and the switch S4 is turned off. The resisters Rpd1 and Rpd2 pull down the voltage at the node 325, because the voltage divider 310 is enabled as in the phase T2. Accordingly, the positive input voltage V+ of the comparator 360 at the node 335 and the negative input voltage V− of the comparator 360 at the node 325 reach the voltage level 410. Unlike in the phase T2, responsive to detecting an improper load condition in the phase T3, the detection signal DET is latched and remains in the high state 450 to indicate an improper load condition at data pin D−. The impedance measurement circuit 200 may enter the phase T1, after the positive input voltage V+ and the negative input voltage V− of the comparator 360 are substantially equal to each other.

As disclosed with respect to FIGS. 2 through 4, the disclosed impedance measurement circuit 200 provides a low cost approach in determining impedance at the data pin for determining loading condition. The impedance measurement circuit 200 eschews injecting high frequency AC signals and performing convoluted calculation for measuring impedance. Instead, the impedance measurement circuit 200 employs inexpensive components and determines impedance at the data pin using DC components. As a result, the disclosed impedance measurement circuit 200 provides an inexpensive solution for determining the loading condition.

Method of Establishing Communication

Figure 5:
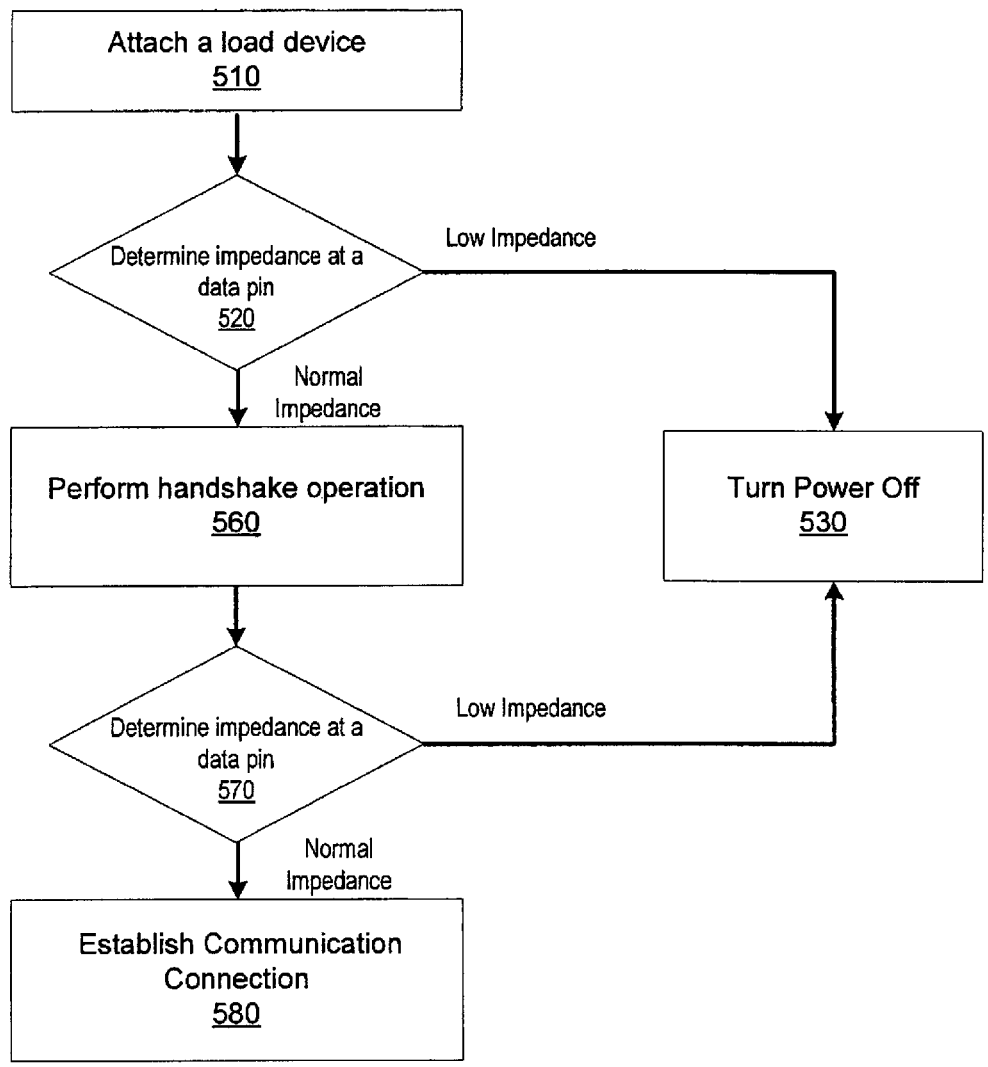
FIG. 5 is a flow chart illustrating a device identifying an improper connection prior to establishing a connection with another device, according to one embodiment.

FIG. 5 is a flow chart illustrating a device 110A identifying an improper connection prior to establishing a connection with a loading device 110B, according to one embodiment. In one embodiment, the device 110A is a charger supplying power to the device 110B through a USB interface. Prior to establishing a communication connection, the devices 110A and 110B perform a handshake operation. The device 110A identifies the improper loading condition as described below in a manner that avoids interfering with the handshake operation.

The device 110A is attached 510 to a loading device 110B through a communication interface 140. The device 110B may turn on a power supply of the device 110A responsive to attaching the load device 110B.

The device 110A determines 520 impedance at a data pin of the communication interface 140 using the impedance measurement circuit 200 as described above with respect to FIGS. 2 through 4. Responsive to determining that impedance at the data pin is low, the device 110A determines the data pin has an improper loading condition and turns the power supply off 530.

Responsive to determining that impedance at the data pin is normal, the device 110A determines the data pin has a proper loading condition and performs 560 a handshake operation. For example in case of the USB interface, the device 110A shorts the data pins D+ and D− and performs handshake operation according to the USB battery charging 1.2 protocol. After finishing the handshake operation (i.e., passing the USB BC 1.2 protocol), the data pins D+ and D− are released.

The device 110A may also determine 570 again impedance at the data pin using the impedance measurement circuit 200. Similarly, responsive to determining that impedance at the data pin is low, the device 110A turns the power supply off 530.

Responsive to determining that impedance at the data pin is normal, the device 110A establishes 580 a communication connection with the loading device 110B. In case the device 110A is a charger, the device 110A supplies power to the loading device 110B.

Other embodiments can perform the steps of FIG. 5 in different orders. Moreover, other embodiments can include different and/or additional steps than the ones described here. For example, the determination of the impedance at the data pin may be performed once in the step 520 before the handshake operation or in the step 570 after the handshake operation. Additionally, the determination of the impedance at the data pin may be performed more than twice.

Figure 6:
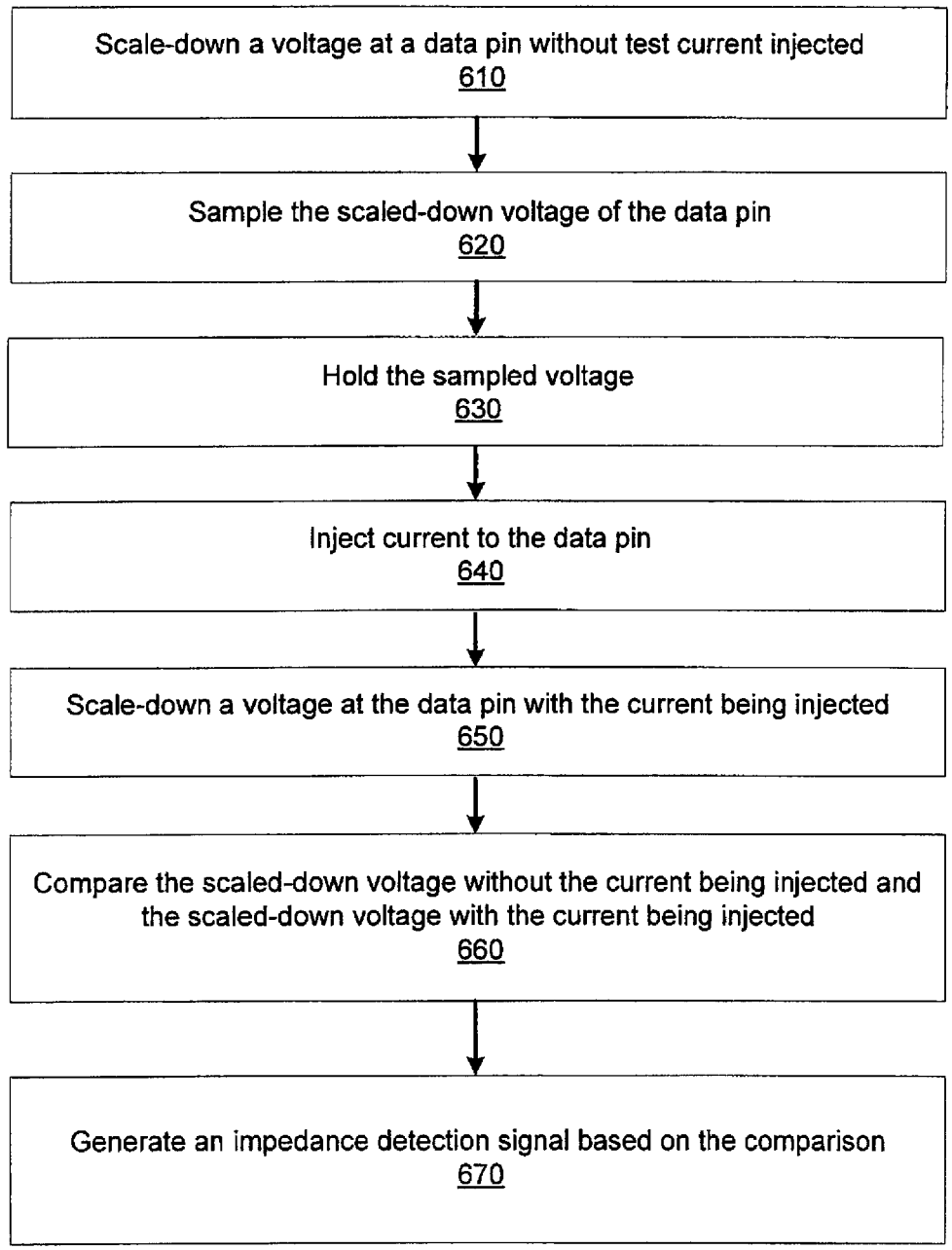
FIG. 6 is a flow chart illustrating the operation of the impedance measurement circuit of FIG. 3, according to one embodiment.

FIG. 6 is a flow chart of operating the impedance measurement circuit of FIG. 3, according to one embodiment. The steps 520 and 570 of FIG. 5 may be performed according to the steps described in FIG. 6.

In one approach, the device 110A senses a voltage at a data pin without the test current Itest being injected. The device 110A scales-down 610 a voltage at a data pin when test current Itest is not injected. In one embodiment, the device 110A employs a voltage divider circuit 310 to scale-down the voltage at the data pin. The device 110A samples 620 the scaled-down voltage of the voltage at the data pin without the test current Itest being injected using the sample and hold circuit 350. In addition, the device holds 630 the sampled voltage using the sample and hold circuit 350. The held voltage may be added with a predetermined threshold voltage V_TH.

In addition, the device 110A senses a voltage at the data pin with the test current Itest being injected. The device 110A injects 640 test current Itest to the data pin. The device 110A scales-down 650 the voltage at the data pin when test current Itest is injected using the voltage divider circuit.

The device 110A compares 660 the scaled-down voltage of the voltage at the data pin without the current being injected and the scaled-down voltage of the voltage at the data pin with the current being injected.

The device 110A generates 670 an impedance detection signal DET based on the comparison. In one approach, the device 110A generates the impedance detection signal DET based on the comparison to indicate low impedance at the data pin is detected. The device 110A determines an improper loading condition at the data pin based on the impedance detection signal DET.

Beneficially, the disclosed device and method enable detection of improper loading condition at a data pin from the device itself. Without receiving indication or notification from another device, the device and method determines improper loading condition at the data pin by measuring impedance at the data pin. For a charging device, self-determination of the improper loading condition prevents supplying power to a loading device with shorted connections and avoids damaging the charging device and the loading device.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A device for determining impedance at a data pin of a communication interface, the device comprising:
   a current source coupled between the data pin and a high supply voltage, the current source configured to selectively inject a test current to the data pin of the communication interface; and
   a sensing circuit to:
      sample a first test voltage,
      hold the first test voltage,
      sense a second test voltage while the first test voltage is held, and
      determine whether the impedance at the data pin is proper by comparing the sensed second test voltage to the held first test voltage added with a predetermined voltage,
   wherein the first test voltage is a scaled-down voltage of a first voltage at the data pin without the test current injected and the second test voltage is a scaled-down voltage of a second voltage at the data pin with the test current injected, and
   wherein the communication interface is a Universal Serial Bus (USB) interface, and the data pin is one of D+ pin and D− pin of the USB interface.

2. The device of claim 1, wherein the device determines that the data pin has a short condition responsive to the determined impedance being smaller than a threshold impedance.

3. The device of claim 1, wherein the device determines that the data pin has a short condition responsive to the second test voltage being smaller than the first test voltage added with the predetermined voltage.

4. The device of claim 1, wherein the sensing circuit comprises:
   a first resistor coupled between the data pin and a node; and a second resistor coupled between the node and a low supply voltage,
wherein the first test voltage and the second test voltage are sensed at the node.

5. The device of claim 4, further comprising a first switch coupled in series with the second resistor, the first switch coupled between the second resistor and the low supply voltage.

6. The device of claim 4, wherein the sensing circuit further comprises:
a sample and hold circuit coupled to the node to sample and hold the first test voltage; and
a comparator to compare the second test voltage to the first test voltage added with the predetermined voltage.

7. The device of claim 6, wherein the sample and hold circuit comprises:
a capacitor, and
a second switch coupled between the node and the capacitor, the capacitor storing the first test voltage responsive to the second switch being turned on.

8. The device of claim 7, wherein the predetermined voltage is added to the first test voltage held by the sample and hold circuit.

9. The device of claim 8, wherein the device determines that the data pin has a short condition responsive to the second test voltage being smaller than the first test voltage added with the predetermined voltage.

10. The device of claim 1, wherein the device is a power supply.

11. A method of determining impedance at a data pin of a communication interface, the method comprising:
scaling down a first voltage at the data pin without a test current injected to the data pin as a first scaled-down voltage;
sampling a first test voltage being the first scaled-down voltage;
holding the first test voltage;
injecting the test current to the data pin;
scaling down a second voltage at the data pin with the test current injected to the data pin as a second scaled-down voltage;
sensing a second test voltage being the second scaled-down voltage while the first test voltage is held; and
determining whether the impedance at the data pin is proper by comparing the sensed second test voltage to the held first test voltage added with a predetermined voltage,
wherein the communication interface is a Universal Serial Bus (USB) interface, and the data pin is one of D+ pin and D− pin of the USB interface.

12. The method of claim 11, further comprising determining that the data pin has a short condition responsive to the determined impedance being smaller than a threshold impedance.

13. The method of claim 12, wherein the threshold impedance is a value between 100Ω and 1000Ω.

14. The method of claim 11, further comprising determining that the data pin has a short condition responsive to the second test voltage being smaller than the first test voltage added with the predetermined voltage.

* * * * *